United States Patent [19]

Helbling

[11] Patent Number: 4,647,935
[45] Date of Patent: Mar. 3, 1987

[54] APPARATUS FOR DETERMINING THE MAGNITUDE OF PHASE DISCONTINUITIES INTRODUCED INTO A RECEIVED SIGNAL AT KNOWN INSTANTS

[75] Inventor: Luis F. Helbling, Nepean, Canada

[73] Assignee: Starnav Corporation, Ottawa, Canada

[21] Appl. No.: 799,990

[22] Filed: Nov. 20, 1985

[30] Foreign Application Priority Data

Dec. 6, 1985 [CA] Canada .................................. 469449

[51] Int. Cl.⁴ ........................... G01S 5/04; G01S 5/02
[52] U.S. Cl. ................................... 342/433; 342/442; 342/357
[58] Field of Search ............... 343/352, 357, 394, 433, 343/434, 435, 442, 443

[56] References Cited

U.S. PATENT DOCUMENTS 3,725,937  4/1973  Schreiber ........................... 343/433
4,472,720  9/1984  Reesor ................................ 343/394

Primary Examiner—Theodore M. Blum
Assistant Examiner—D. C. Cain
Attorney, Agent, or Firm—Larson & Taylor

[57] ABSTRACT

An apparatus for tracking phase discontinuities introduced into a received signal at known instants is disclosed. The phase discontinuities are introduced into the received signal by command signals derived from a system timing reference. A controlled oscillator generates an output signal at the same frequency as the received signal. The controlled oscillator introduces into the output signal a phase jump having a magnitude and timing determined by a control signal applied to its input. A synchronous detector responsive to phase jumps in the received signal generates the control signal so as to introduce a phase jump into the output signal at the known instants equal in magnitude and sign to the detected phase jumps. The controlled oscillator and synchronous detector constitute a delta phase tracking loop which is capable of tracking the discontinuities in phase. The apparatus can be used to derive orientational information from a radio signal transmitted from a source whose position is known or can be determined.

19 Claims, 13 Drawing Figures

FIG. I

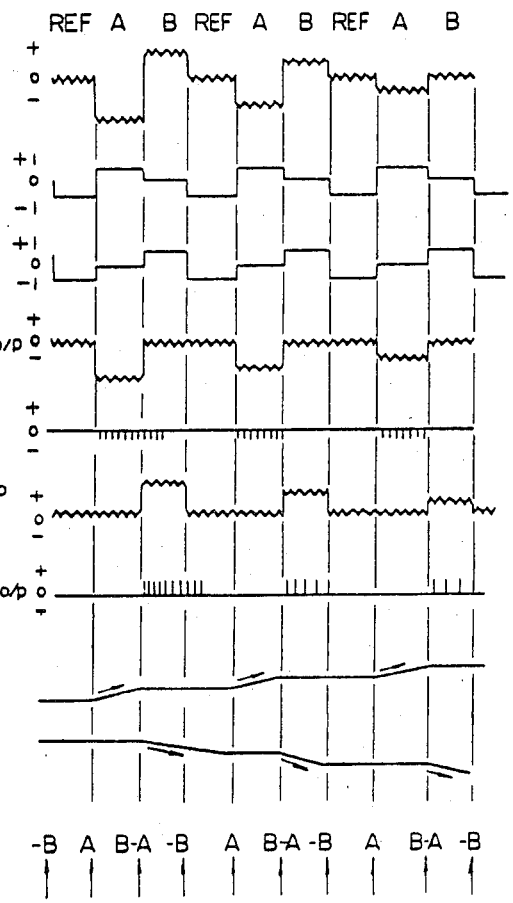

APPARATUS FOR DETERMINING THE MAGNITUDE OF PHASE DISCONTINUITIES INTRODUCED INTO A RECEIVED SIGNAL AT KNOWN INSTANTS

BACKGROUND TO THE INVENTION

This invention relates to an apparatus for tracking phase discontinuities introduced into an incoming signal at known instants, particularly phase discontinuities caused by switching between antenna elements in a navigation system providing orientation information.

Current radio navigation systems are mainly land-based and suffer from system inaccuracies or poor surface coverage. One such system in commercial use is Loran C, which is capable of giving positional information to an accuracy in the order of 0.25 nautical miles. The range of Loran C is limited to coastal areas, and it is not feasible for the system to provide world-wide coverage. OMEGA is a system presently consisting of eight stations spanning the world and transmitting unique identification data on the VLF Band. The accuracy of OMEGA is severely limited by propagation errors, and an accuracy in the order of 2 to 4 nautical miles is all that can be expected.

It has long been recognized that satellites can be used to provide a world-wide accurate radio navigation system. The major existing satellite system in use is called TRANSIT. This system employs six satellites in low polar orbits. The TRANSIT system makes use of doppler shifts to derive velocity vectors from which positional information can be derived. The main disadvantage of the TRANSIT system is that the coverage is periodic, with the interval between possible fixes being as much as ninety minutes.

In order to overcome the disadvantages of the TRANSIT system, which will be gradually phased out, work is now in progress to install a brand new satellite navigation system known as NAVSTAR. NAVSTAR will eventually consist of a constellation of eighteen satellites in six 12-hour orbits with three active spares. The disposition of the orbits and the satellites within the orbits will be such that at least four satellites will be within view of any location on Earth at any particular time. Each satellite transmits two link signals, L1 and L2, at 1,575.42 MHz and 1,227.6 MHz, respectively. The in-phase component of L1 is modulated with a precision (P) code and the quadrature component of L1 is modulated with a clear acquisition (C/A) code. L2 is modulated only with the P code. The C/A and P codes enable an authorized user to lock onto the signals and extract satellite identification and timing information. In addition to the codes, the L1 and L2 signals are also modulated with data at a lower bit rate giving precise ephemeris information pertaining to the satellite orbit. The authorized user can calculate from this information the position of the satellite and hence, by taking a fix on a plurality of satellites simultaneously, can calculate his exact coordinates. By measuring the doppler shifts in the received signals, the user can also derive velocity information.

The basic NAVSTAR system will not, however, give information about the orientation of the user, namely heading and attitude information. Clearly the heading of a vehicle, such as a ship or aircraft, may be quite different from the direction of its velocity vector. This information can in theory be derived if at least three spaced antenna elements are used, and interferometric measurements are made to determine the orientation of the base line vector separating the antenna elements relative to the transmitting satellite. By observing a number of satellites, the user can derive complete information pertaining to the orientation of the platform mounting the antenna. A significant problem therefore arises as to how to measure accurately the phase difference between the antenna elements.

SUMMARY OF THE INVENTION

Accordingly, the present invention provides an apparatus for tracking phase discontinuities introduced into an incoming signal at known instants, comprising: timing means for generating clock signals; means for generating command signals to introduce said phase discontinuities into said incoming signal at known instants; a controlled oscillator generating an output signal tracking the carrier of the incoming signal, said controlled oscillator being capable of introducing into said output signal phase jumps having a magnitude and sign determined by a control signal applied to an input thereof; a phase discriminator receiving at its respective inputs said incoming signal and said output signal, and producing at its output a signal representing the difference in phase therebetween; and means responsive to phase jumps observed at the output of the phase discriminator to generate said control signal so as to introduce a phase jump into said output signal of the controlled oscillator at said known instants equal in magnitude and sign to the phase jumps in the incoming signal, said controlled oscillator and said control signal generating means thereby constituting a delta phase tracking loop which tracks the phase discontinuities introduced into the incoming signal.

In a preferred embodiment, the controlled oscillator also forms part of a carrier tracking loop. In this embodiment, the input signal is applied to one input of a phase discriminator having its other input connected to the output of the controlled oscillator. The output of the phase discriminator is connected to the input of the synchronous detector as well as a second input of the controlled oscillator through the carrier tracking loop, which determines the frequency of the output signal, so that the delta phase and carrier tracking loops are arranged in tandem.

This apparatus has the capability of tracking accurately phase discontinuities caused by switching between adjacent antenna elements in an antenna array. The magnitude of the phase discontinuity determines the angle between the base line vector of the antenna array and the vector to the satellite. If the orientation angle $\phi$ for three satellites with respect to the antenna base plane is known, the complete orientation of the antenna platform, namely attitude and heading, can be determined.

The invention also provides an apparatus for deriving orientational information from a received signal, comprising: an antenna array having a plurality of antenna elements located in fixed relative positions; receiver means for receiving a signal transmitted from a source whose position can be determined; switching means for selectively coupling said antenna elements to said input means; timing means for generating clock signals; means for generating command signals to control said switching means so as to couple said antenna elements successively to said receiver means at known instants in relation to said clock signals and thereby introduce a phase jump into the incoming signal; a controlled oscillator generating an output signal at the same frequency as the received signal, said controlled oscillator being capable of introducing into said output signal a phase jump having a magnitude and sign determined by a control signal applied to an input thereof; a phase discriminator receiving at its respective inputs said incoming signal and said output signal, and producing at its output a signal representing the difference in phase therebetween; and means responsive to phase jumps observed at the output of the phase discriminator to generate said control signal so as to introduce a phase jump into said output signal of the controlled oscillator at said known instants equal in magnitude and sign to the phase jumps in the received signal, said controlled oscillator and said control signal generating means thereby constituting a delta phase tracking loop which tracks the phase discontinuities introduced into the incoming signal, whereby when said delta phase loop is tracking said signal received at the input means said control signal represents the phase difference betwen the signals received at successive antenna elements.

With this apparatus, the phase errors can be contained within the antenna assembly, which is mounted in an exposed location. The receiver equipment will normally be mounted in the navigation room, but unlike the prior art, the signals from all the antenna elements pass successively over the same line, so that any phase changes introduced by physical flexing of the line and the like apply equally to the signals from all the antenna elements.

The delta phase tracking loop enables the phase shift between the signals arriving at successive antenna elements to be accurately determined, and this phase shift in turn enables the angle between the base line vector connecting successive antenna elements and the vector to the signal source to be calculated.

BRIEF DESCRIPTION OF DRAWINGS

The invention will now be described in more detail, by way of example only, with reference to the accompanying drawings, in which:

FIG. 4 is a wave-form chart illustrating the operation of the tracking apparatus.

DESCRIPTION OF THE PREFERRED EMBODIMENT

Figure 1:
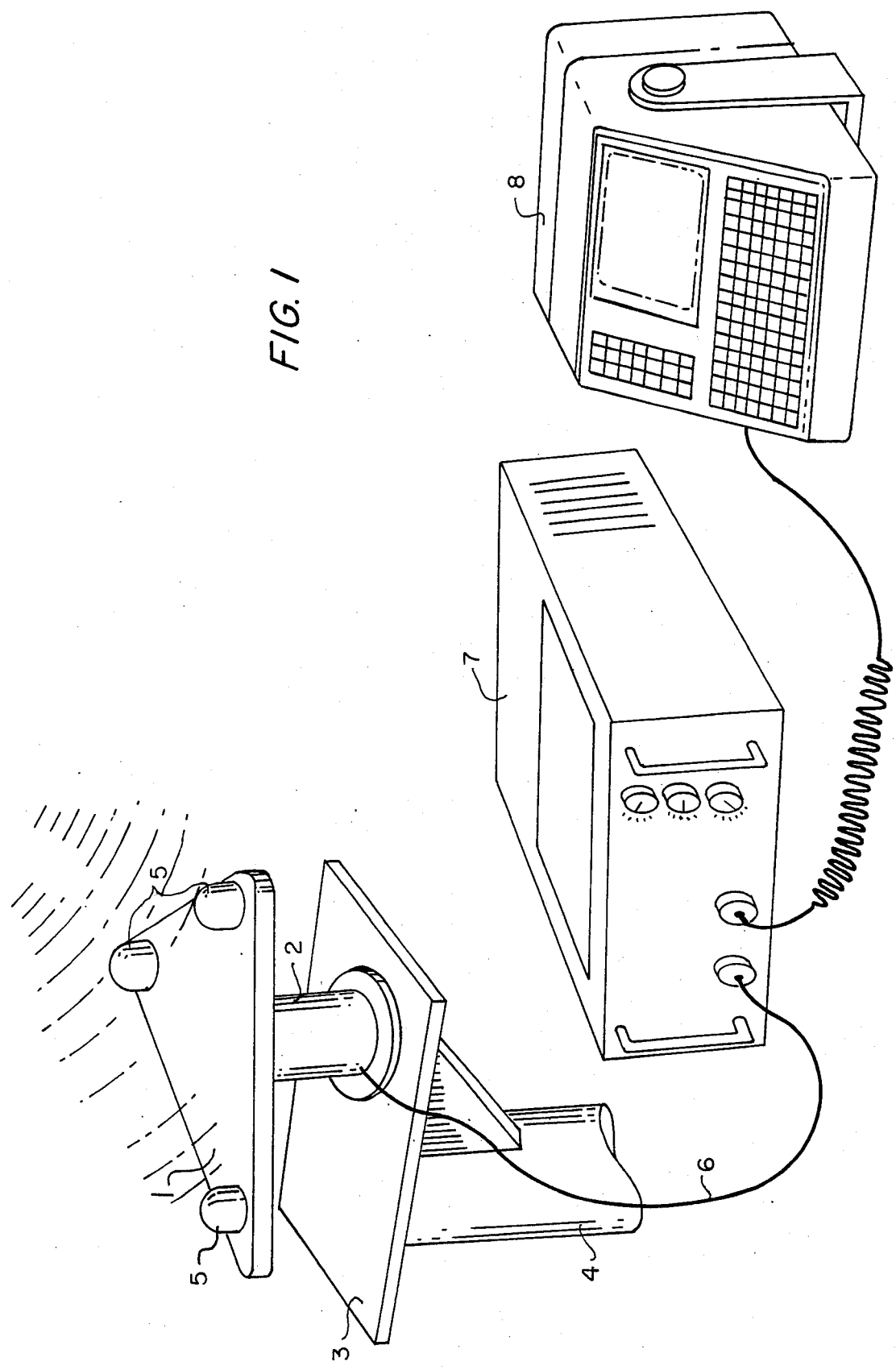
FIG. 1 illustrates a complete satellite navigation system capable of deriving position, attitude and heading information from NAVSTAR signals.

It will be assumed that the navigation receiver system shown in FIG. 1 is intended for use on a ship.

The apparatus comprises a triangular antenna platform 1 fixably mounted to a plate 3 located in an elevated position, such as on a mast 4 of the ship. The precise orientation of the antenna platform 1 relative to the ship is therefore fixed. The platform 1, supported on an antenna post 2, has the shape of a triangle. Antenna elements 5, each capable of receiving L-band signals from a NAVSTAR satellite, are located at the apices of the triangle. In the antenna post 2 is located a switching matrix (not shown) for successively coupling transmission line 6 to the antenna elements 5. The transmission line 6 applies the antenna signals to a signal processing unit 7, which in turn is connected to a control and display unit (CDU) 8, located at a convenient place in the ship, such as at the navigator's table.

When the base line between adjacent antenna elements is inclined relative to the direction vector of the incoming wavefront, the path difference betweeen the adjacent antenna elements causes a phase difference to arise between the signals received at the adjacent antenna elements. As the switching matrix switches from one antenna element to the next, this phase difference shows up as a phase discontinuity, the magnitude of which is related to the inclination of the base line vector in relation to the direction vector of the incoming wavefront. By using the triangle configuration, illustrated in FIG. 1, complete attitude, that is inclination of the antenna platform with respect to the horizontal, and heading, that is orientation of the platform with respect to north, can be derived. With the two element configuration, heading and pitch information oriented in the fore-aft directions can be derived.

The signal processing unit (SPU) 7 sends command signals to the switching matrix (not shown) to cause the switching between adjacent antenna elements to occur at known instants. The SPU 7 also determines the positions of the satellites from the information carried on the satellite signals, which have to be known in order to enable the attitude and heading information to be calculated.

The control-and-display unit 8 enables the necessary access codes to be entered to permit the equipment to lock onto the satellite signals and also displays the output information on the display screen.

Figure 2:
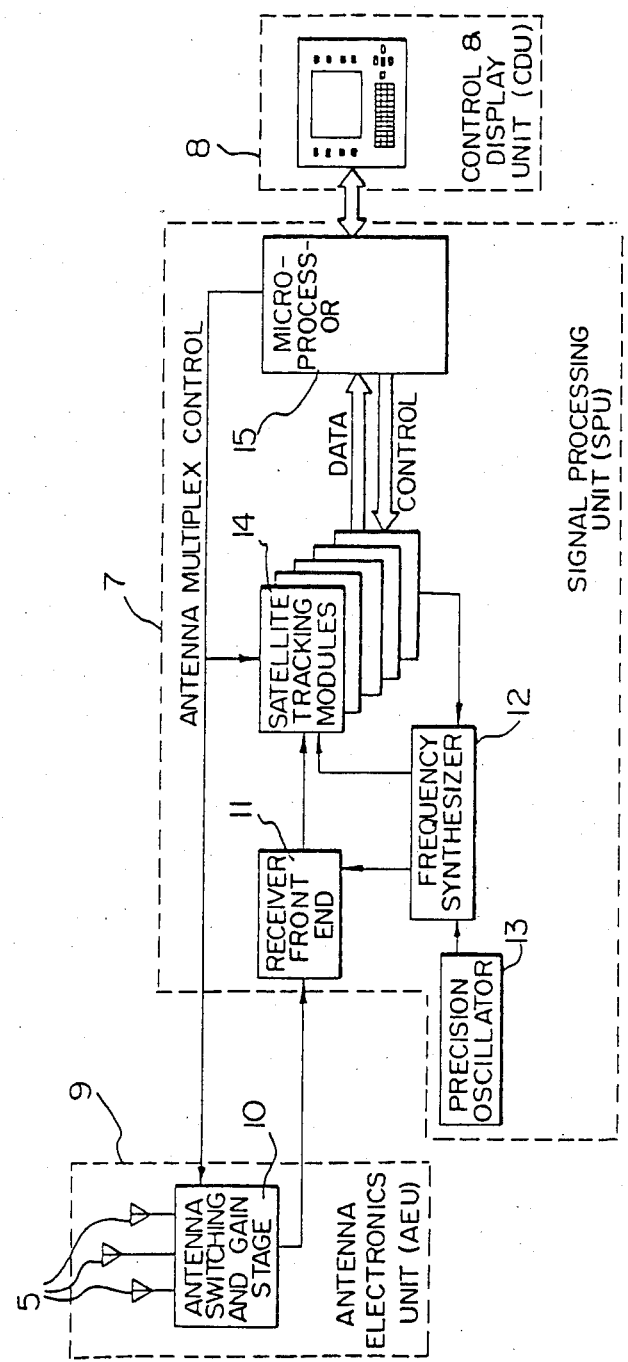
FIG. 2 is a block diagram of the complete satellite receiving system.

In FIG. 2, the antenna electronics unit 9 comprises the switching matrix 10, coupled to the individual antenna elements 5. The SPU 7 comprises the receiver front end 11, which contains the necessary microwave and RF circuitry for receiving the satellite signals, a frequency synthesizer 12, a precision oscillator 13, five satellite tracking modules 14, and a microprocessor 15. Each satellite tracking module 14 tracks a given satellite, so that with the equipment illustrated up to five satellites can be tracked simultaneously. The satellites transmit two link signals L1 and L2 respectively at central frequencies of 1,575.42 MHz and 1227.6 MHz, which are respective multiples (154 and 120) of a 10.23 MHz clock frequency. The L1 signal has the form $$S_L li(t)_i = A_i XP_i(t)D_i(t) \cos(\omega_i t + \phi) + A_C XG_i(t)D_i(t) \sin(\omega_i t + \phi)$$

where XP represents a unique P code for that satellite transmitted at a chipping rate of 10.23 Mbits per second, D (t) represents data modulo-2 added to the P code and having a transmission rate of 50 bits per second, and XG is a unique clear/acquisition code, having a clock rate of 1.023 Mbits per second. The L2 signal transmits only P code and data.

The P code and C/A code identify the satellite and give accurate timing information. Knowing the appropriate codes, the user's equipment can lock onto the C/A code with relative ease. The data stream contains complete ephemeris information relating to the orbit of the satellite. If at least three satellites, whose positions at any instant are known, are tracked, an accurate fix can be obtained. It is proposed that civilian users will have access to 100 m accuracy. Previously proposed NAVSTAR receivers will give only this information, namely accurate positional information or possibly velocity information, which can be derived from the doppler shifts at the incoming signals.

Figure 3:
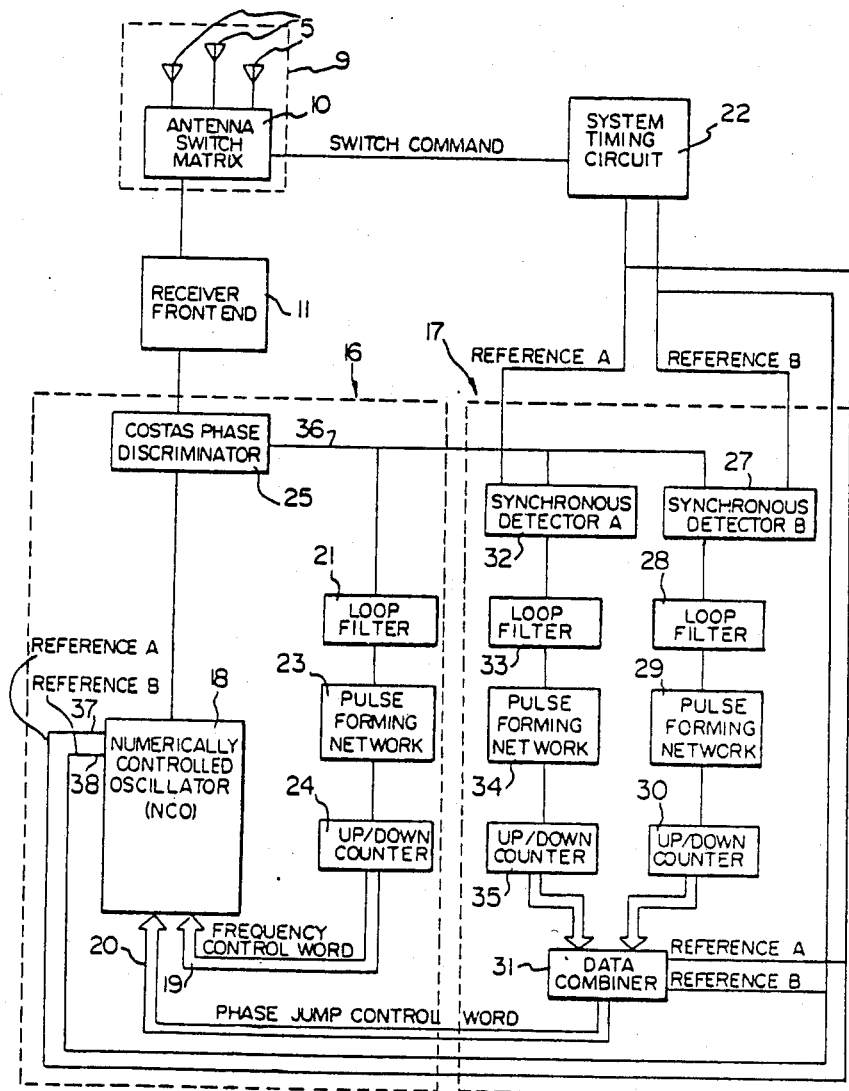
FIG. 3 is a block diagram of an apparatus for tracking the phase discontinuities introduced as the switching matrix is coupled to successive antenna elements.

FIG. 3 is a block diagram of a circuit for deriving heading and attitude information, when the position of the transmitting satellite is known. The antenna electronics unit 9 comprises three antenna elements 5 and the antenna switching matrix 10. The antenna elements 5 are connected through the switching matrix 10 to the receiver front end 11, as shown in FIG. 2. The receiver front end 11 carries out all the necessary functions to receive and detect the spread spectrum signals received by the antenna elements 5.

The circuit shown in FIG. 3 comprises a carrier tracking loop 16 and a delta phase tracking loop 17, arranged in tandem, which together, are found on each satellite tracking module 14. Signals from the receiver front end 11 are applied to one input of a Costas phase discriminator 25, the other input of which receives the output of a numerically controlled oscillator 18 having first and second inputs receiving respectively phase jump control and frequency control signals. The oscillator 18 generates an output signal having a frequency determined by a frequency control word applied to the input 19. The numerically controlled oscillator (NCO) 18 also introduces phase jumps into the output signal, having a magnitude determined by a phase jump control word applied to the input 20, and timing determined by reference signals applied to inputs 37, 38. The output 36 of the Costas phase discriminator 25 is applied to a phase lock loop filter 21, connected to a pulse forming network 23, which is in turn connected to an up/down counter 24 that generates the frequency control word applied to the input 19 of the numerically controlled oscillator 18. The loop 16 tracks the carrier of the incoming signals.

The antenna switch matrix 10 is connected to a timing system circuit 22, which issues switch commands to cause the switch matrix 10 to switch the next antenna element to the receiver front end 11, an operation which introduces a phase discontinuity caused by the path difference between the two adjacent antenna elements into the signal applied to the receiver front end 11, and two reference signals A and B.

The output 36 of the Costas phase discriminator 25 is connected to two arms of a delta phase tracking loop 17. The first arm comprises a synchronous detector 32, a loop filter 33, a pulse-forming network 34, and an up/down counter 35. The second arm comprises a synchronous detector 27, a loop filter 28, a pulse-forming network 29, and an up/down counter 30. The up/down counters 30,35 are connected to a data combiner 31, receiving reference signals A and B, the output of which forms the phase jump control word applied to the input 20 of the numerically controlled oscillator 18. The reference signals A and B for the system timing circuit 22 are also applied to inputs 37 and 38 of the numerically controlled oscillator 18.

The operation of the apparatus will now be described, first with reference to the carrier tracking loop 16.

The phase discriminator 25 generates a DC error signal representative of the difference in phase between the output of the NCO 18 and the output of the receiver front end 11. The carrier loop filter 21 has a long time constant and is therefore relatively insensitive to phase jumps occurring upon antenna switching. The pulse forming network 32 is a dual polarity, fixed threshold, indeterminant periodicity, integrate-and-dump network having a transfer characteristic of the form:

$$V(t) = \int x \, dt$$

When the output of the loop filter 21 reaches a predetermined value, the pulse forming network 32 generates a single pulse, whose duration and magnitude are predetermined, but whose polarity is determined by the sign of the output of the loop filter. At this time V(t) is reset to zero. A positive error signal causes the pulse forming network to produce a positive pulse and vice versa.

Each positive pulse increments the value stored in the up/down counter 33 by one, whereas each negative pulse decrements this value by one. The valve stored in the up/down counter 33 is the frequency control word that is applied to input 19 of the numerically controlled oscillator 18.

In operation, because of the long time constant of the loop filter 21, the carrier tracking loop is essentially insensitive to the phase jumps introduced by the antenna switching. An error signal at the output 36 of the phase discriminator 25 changes the frequency control word in the up/down counter 24 to cause the output of the NCO 18 to track the carrier of the received signal coming from the receiver front end 11.

The output 36 of the discriminator 25 is shown in FIG. 4. When the tracking loop 16 is faithfully tracking the carrier, the mean output of the discriminator is zero. As the antenna elements are changed, there is a phase jump in the received signal. Initially, this is not reflected in the output of the NCO, and therefore the output of the phase discriminator jumps to reflect this phase difference. As the delta phase tracking loop (to be described in more detail below) comes into operation, the jumps in the output of the phase discriminator on antenna switching are gradually reduced.

The reference signals A and B are generated by the system timing circuit 22 and shown in FIGS. 4B and 4C. Each reference signal has three levels, −1, 0 and +1. The three antenna elements 5 can be regarded as consisting of a reference antenna and elements A and B. When the reference antenna element is selected, both reference signals A and B are at level −1. When antenna element A is selected, reference signal A is at level +1 and reference signal B is at level 0. When antenna element B is selected, reference signal A is at level 0 and reference signal B is at level +1.

In synchronous detector A 32, the output 36 of the Costas phase discriminator 25 is multiplied by the reference signal A, that is by −1 when the reference antenna element is selected, +1 when the antenna element A is selected, and 0 when the antenna element B is selected. Consequently, the synchronous detector A is insensitive to the phase discriminator output 36 when the antenna element B is selected. The mean output of the synchronous detector A is given by the mean value of the discriminator output 36 when the antenna element A is selected less the mean value of the discriminator output when the reference antenna element is selected, which is zero when the carrier tracking loop is in lock, as shown in FIG. 4D.

The output of the synchronous detector A 32 is fed through the loop filter 33 to a pulse forming network 34 similar to the pulse-forming network 23 connected in the carrier tracking loop. The pulse forming network 34 generates a train of pulses, as shown in FIG. 4E, the number of which represents the magnitude, and the polarity of which represents the sign, of the error signal generated by the synchronous detector A 32 for the antenna element A.

The pulses, generated by the pulse forming network 34, cause the up/down counter 35 to increment or decrement, according to the sign of the pulses, as shown in FIG. 4H.

The B arm of the delta phase tracking loop 17 operates in the same way as the A arm, except that A and B are interchanged. The synchronous detector B 27 is insensitive to the output 36 of the phase discriminator 25 when the antenna element A is selected. FIGS. 4F and 4G show respectively the outputs of the synchronous detector B and the pulse forming network 29. FIGS. 4H and 4I show how the values in the up/down counters A and B are changed by the pulses generated in the respective pulse forming networks 34 and 29.

The words stored in the up/down counters 35 and 30 are applied to a data combiner 31, which receives at its inputs the reference signals A and B. When the carrier tracking loop is in lock, the outputs of the up/down counters 35, 30 represent the phase jump produced as the switch matrix 10 switches from the reference antenna element to the respective antenna elements A and B. The data combiner 31, as shown in FIG. 4J, produces an output representative of the phase jump occurring as the switch matrix switches successively through reference antenna element, antenna element A, and antenna element B. The data combiner 31 generates the phase jump control word input 20 of the NC 18. The phase jump control word defines the magnitude and sign (direction) of the phase jump which is as indicated in FIG. 4J. Thus, if we take the phase of the NCO while the reference antenna element is selected as a reference phase (0), then the phase after a transition from the reference antenna element to antenna element A is $0+A=A$. Subsequently, when the next transition occurs from the antenna element A to antenna element B, the phase becomes $A+(B-A)=B$. Finally, when the switch selects the reference antenna again, the phase reverts back to zero $(B-B=0)$.

The precise instant at which the phase jump is introduced is determined by the reference signal waveforms A and B, which are also applied to the NCO 18.

The NCO 18 adds the phase jump control word to the frequency control word when an antenna element switchover occurs, for one clock period of the NCO. Consequently, a phase jump is introduced into the output of the NCO of nearly equal magnitude to the phase jump observed at the output of the receiver front end or antenna switch matrix 10 output.

As the delta phase tracking loop gradually comes into lock, the deviations from the mean value of the discriminator output are gradually reduced, as shown in FIG. 4A. Initially, prior to delta phase lock, the error signal fully represents the phase jump introduced by the antenna element switchover. As the delta tracking loop comes into lock, this error signal gradually approaches the mean value.

The magnitude of the correction applied to the input 20 is a measure of the phase jump caused by the switching, and this correction can be used to derive the attitude and heading information discussed above.

The system described enables the phase difference between the signals arriving at successive antenna elements to be accurately determined, and from this and the data on the satellite signals, not only position and velocity information, but also the heading and attitude of the platform 1, and hence the ship. The described system is not susceptible to phase error mismatch difficulties that arise with alternative systems, and as a result has the capability of giving accurate heading and attitude information, while at the same time not requiring a complex electronic package to be located adjacent the antenna. Only the switching matrix need be designed for external mounting, and this can be conveniently mounted on the antenna sub-assembly.

I claim:

1. An apparatus for tracking phase discontinuities introduced into a incoming signal at known instants, comprising: timing means for generating clock signals; means for generating command signals to introduce said phase discontinuities into said incoming signal at known instants; a controlled oscillator generating an output signal tracking the carrier of the incoming signal, said controlled oscillator being capable of introducing into said output signal phase jumps having a magnitude and sign determined by a control signal applied to an input thereof; a phase discriminator receiving at its respective inputs said incoming signals and said output signal, and producing at its output a signal representing the difference in phase therebetween; and control signal generating means responsive to said phase jumps observed at the output of the phase discriminator to generate said control signal so as to introduce a phase jump into said output signal of the controlled signal at said known instants equal in magnitude and sign to the phase jumps in the incoming signal, said controlled oscillator and said control signal generating means thereby constituting a delta phase tracking loop which tracks the phase discontinuities introduced into the incoming signal.

2. An apparatus according to claim 1, wherein said control signal generating means receives said command signals as a timing reference.

3. An apparatus according to claim 2, wherein said controlled oscillator has a second input which receives a second control signal determining the frequency of said output signal, and said phase discriminator and said controlled oscillator form part of a carrier tracking loop.

4. An apparatus according to claim 3, wherein the carrier tracking loop further comprises a loop filter, having a long time constant such that it is relatively insensitive to said phase discontinuities, connected to the output of the phase discriminator.

5. An apparatus according to claim 4, wherein the controlled oscillator is a numerically controlled oscillator.

6. An apparatus according to claim 5, wherein the loop filter is connected to a pulse-forming network connected to an up/down counter storing a frequency control word determining the output frequency of the numerically controlled oscillator, said pulse forming network generating pulses to increment or decrement the up/down counter according to the magnitude and sign of the output of the phase discriminator.

7. An apparatus according to claim 1, wherein said control signal generating means comprises a synchronous detector responsive to the output of the phase discriminator and a reference signal from the timing means to generate an output representative of the phase jump observed by the phase discriminator on the introduction of a said phase discontinuity, and means for deriving from the output of the synchronous detector said control signal for introducing said phase jump into the output of the controlled oscillator.

8. An apparatus according to claim 7, wherein the controlled oscillator is a numerically controlled oscillator.

9. An apparatus according to claim 8, wherein said synchronous detector is connected through a pulse forming network to an up/down counter storing a control word used for determining the phase jump to be introduced into the output signal of the numerically controlled oscillator.

10. An apparatus according to claim 9, comprising a loop filter between the synchronous detector and the pulse forming network.

11. An apparatus according to claim 1, further comprising a switching matrix for coupling individual antenna elements capable of receiving said incoming signal successively to said apparatus, and said control signal generating means controlling the operation of said switching matrix, whereby said phase discontinuities are introduced into the received signal as said switching matrix switches from one antenna element to the next.

12. An apparatus for deriving orientational information from a received signal, comprising: an antenna array having a plurality of antenna elements located in fixed relative positions; receiver means for receiving a signal transmitted from a source whose position can be determined; switching means for selectively coupling said antenna elements to said receiver means; timing means for generating clock signals; means for generating command signals to control said switching means so as to couple said antenna elements successively to said receiver means at known instants in relation to said clock signals and thereby introduce a phase jump into the incoming signal; a controlled oscillator generating an output signal at the same frequency as the received signal, said oscillator being capable of introducing into said output signal a phase jump having a magnitude and sign determined by a control signal applied to an input thereof; a phase discriminator receiving at its respective inputs said incoming signal and said output signal, and producing at its output a signal representing the difference in phase therebetween; and control signal generating means responsive to phase jumps observed at the output of the phase discriminator to generate said control signal so as to introduce a phase jump into said output signal of the controlled oscillator at said known instants equal in magnitude and in sign to the phase jumps in the received signal, said controlled oscillator and said control signal generating means thereby constituting a delta phase tracking loop which tracks the phase discontinuities introduced into the incoming signal, whereby when said delta phase loop is tracking said signal received at the input means said control signal represents the phase difference between the signals received at successive antenna elements.

13. An apparatus according to claim 12, wherein said antenna array and switching means form part of a subassembly constructed so as to contain therein substantially all sources of phase error mismatch.

14. An apparatus according to claim 12, wherein said controlled oscillator has a second input which receives a second control signal determining the frequency of said output signal, and said receiver means is coupled to a phase discriminator which, together with said controlled oscillator, forms part of a carrier tracking loop.

15. An apparatus according to claim 12, comprising at least three antenna elements lying at the apices of a triangle.

16. An apparatus according to claim 15, wherein said oscillator is a numerically-controlled oscillator.

17. An apparatus according to claim 16, wherein the delta phase tracking loop comprises two branches, each comprising a synchronous detector connected to the output of the phase discriminator, a pulse-forming network, and an up/down counter storing a control word determining the phase jump to be introduced into the output signal of the numerically controlled oscillator.

18. An apparatus according to claim 17, wherein the synchronous detectors receive reference signals indicating the selected antenna from the timing circuit.

19. An appratus according to claim 18, wherein each branch provides information relating to the phase jump relative to a reference antenna element, and a data combiner forms a control word from the numerically controlled oscillator, which takes into account the switching order.

* * * * *